United States Patent [19]

Kim

[11] Patent Number: 5,077,236
[45] Date of Patent: Dec. 31, 1991

[54] METHOD OF MAKING A PATTERN OF TUNGSTEN INTERCONNECTION

[75] Inventor: Eui-Song Kim, Incheon, Rep. of Korea

[73] Assignee: Samsung Electronics Co., Ltd., Kyounggi, Rep. of Korea

[21] Appl. No.: 547,518

[22] Filed: Jul. 2, 1990

[51] Int. Cl.$^5$ .......................................... H01L 21/44
[52] U.S. Cl. .................... 437/192; 437/193; 437/233; 437/228; 148/DIG. 105
[58] Field of Search ............... 437/193, 192, 200, 228, 437/233; 156/643, 633; 357/59 K; 148/DIG. 105

[56] References Cited

U.S. PATENT DOCUMENTS

| | | | |
|---|---|---|---|
| 4,362,597 | 12/1982 | Fraser et al. | 156/643 |
| 4,622,735 | 11/1986 | Shibata | 148/DIG. 147 |
| 4,630,357 | 12/1986 | Rogers et al. | 437/195 |
| 4,631,806 | 12/1986 | Poppert et al. | 437/192 |
| 4,740,484 | 4/1988 | Norstrom et al. | 437/193 |
| 4,741,802 | 5/1988 | Okumura | 437/228 |
| 4,778,563 | 10/1988 | Stone | 156/643 |
| 4,804,560 | 2/1989 | Shioya et al. | 437/192 |
| 4,847,111 | 7/1989 | Chow et al. | 437/200 |
| 4,859,619 | 8/1989 | Wu et al. | 357/41 |
| 4,908,332 | 3/1990 | Wu | 437/193 |

FOREIGN PATENT DOCUMENTS

| | | | |
|---|---|---|---|
| 0008971 | 7/1979 | Japan | 437/193 |
| 0044730 | 2/1988 | Japan | 437/192 |

OTHER PUBLICATIONS

Van Laarhoven et al., "A Novel Blanket Tunsten Etchband Scheme", Jun. 12-13, 1989, VMIC Conference; pp. 129-135.

Wang, "Plasma Etching of Poly Si in $SF_6$-$O_2$ Mixtures" Jun. 25-26, 1985 V-MIC Conference, pp. 335-339.

"Thermodynamic . . . Fluoride Process", Carlson et al., Thin Solid Films, 158 (1988) 107-122.

R. S. Blewr, Progess in LPCVD Tungsten . . . Applications Reprinted from Solid State Technology, Nov. 1986.

T. Bonifeld, et al., Triple Level Metallization . . . Interconnects Mat. Res. Soc. Symp. Proc. VLSIV 1990.

A. S. Inamdar, et al., Step Coverage . . . via Base 1989, Material Research Society.

*Primary Examiner*—Brian E. Hearn
*Assistant Examiner*—Trung Dang
*Attorney, Agent, or Firm*—Ladas & Parry

[57] ABSTRACT

A method of making a pattern of tungsten interconnection comprising the step of: forming a polysilicon film (18) over a first insulating film (12) on a semiconductor substrate (11) and doping impurities; forming a high doped oxide film (19) over the polysilicon film and subsequently forming a metal interconnect pattern; growing selectively tungsten (15) on an exposed portion of the polysilicon film; stripping the high doped oxide film by wet etching and etching a residual (20) of the tungsten formed on the oxide film; and dry etching the polysilicon by using the tungsten on the polysilicon as a etching mask leaving only the polysilicon underneath the tungsten. The method can solve the troubles produced when the tungsten is used as metal interconnect material and improve the operation speed of the semiconductor devices with the interconnection of the tungsten metal, offering a reliability of the device for a long time operation.

5 Claims, 2 Drawing Sheets

METHOD OF MAKING A PATTERN OF TUNGSTEN INTERCONNECTION

BACKGROUND OF THE INVENTION

The present invention relates to a method of manufacturing semiconductor devices, more particularly to a method of making a pattern of tungsten (W) film which is used for metal interconnection.

On semiconductor substrate, many devices are formed through various manufacturing processes and metal films are used to interconnect these devices to each other. The metal interconnection is achieved through photomasking and metal etching processes after deposition of the thin metal film of mostly 1.0–1.5 μm.

Presently, aluminum (Al) containing silicon (Si) at the proper ratio is widely used as the metal material in the semiconductor manufacturing processes. When the aluminum is used for the metal interconnection, however, the aluminum film is thinned by electromigration phenomenon and in the worst case the aluminum film is disconnected, thereby bring about no operation of the semiconductor devices.

Particularly, as the semiconductor devices become more and more high-integrated, such a problem often occurs since the metal interconnect films are more thinned.

In order to prevent the thinning of the metal interconnect films due to the electromigration phenomenon, tungsten (W) with a large atomic radius and heavy mass is used as the metal interconnect material. Also, the operation speed of the semiconductor devices is improved due to a low ohmic resistivity of tungsten and for a long time it can be reliable. But, since the conventional method of forming the tungsten interconnect pattern employed the etch back process as shown in FIG. 1, the surface of the semiconductor devices is rough, thereby leading to many difficulties at the next processes.

To investigate this process in detail, a first insulating layer 2 is first formed on a substrate 1 and doped. Next, a second insulating film 3 is deposited by the chemical vapor deposition (CVD) technology, and the pattern for the deposition of tungsten 5 is formed through the photomasking and etching processes. After an adhesive material 4 is deposited over the pattern to improve the adhesion of the tungsten the tungsten 5 is grown by selective CVD technology. Subsequently, in order to remove the dot-line portion in FIG. 1, the etch back process is carried out, thereby becoming the shown in FIG. 1.

If the tungsten interconnection is formed by this method, voids 6 are produced due to the step coverage of the tungsten and the surface of the insulating film 3 becomes very rough during the etch back process, and a residual 7 of the tungsten remains on the insulating film 3. Accordingly, there occurs the problem that the short phenomenon between the tungsten interconnect lines is brought about due to the residual 7 of the tungsten in the next processes.

SUMMARY OF THE INVENTION

The present invention has been made in consideration of this and has it for the object to provide a method of making a pattern of tungsten interconnection, which removes voids defects in the tungsten interconnect and also does not leave a residual of the tungsten on an insulating film.

Another object is to provide a method of making a pattern of tungsten interconnection, which does not deteriorate the surface roughness of an insulating film to be deposited as a protective film after a formation of the tungsten pattern.

According to the present invention, there is provided a method of making a pattern of tungsten interconnection, comprising the steps of: (a) forming a polysilicon film over a first insulating film on a semiconductor substrate and doping impurities; (b) forming a high doped oxide film over the polysilicon film and subsequently forming a metal interconnect pattern; (c) growing selectively tungsten on an exposed portion of the polysilicon film; (d) stripping the high doped oxide film by wet etching and etching a residual of the tungsten formed on the oxide film at the same time; and (e) dry etching the polysilicon by using the tungsten on the polysilicon as a etching mask leaving only the polysilicon underneath the tungsten.

BRIEF DESCRIPTION OF THE INVENTION

These and other objects, features, and advantages of the present invention will become more apparent from the following description of the preferred embodiments taken in conjunction with the accompanying drawings, in which.

FIGS. 3A–E show the various steps of the formation method of the tungsten interconnection according to the present invention.

DETAILED DESCRIPTION OF THE INVENTION

The present invention will be now described in more detail with reference to accompanying drawings.

Figure 1:
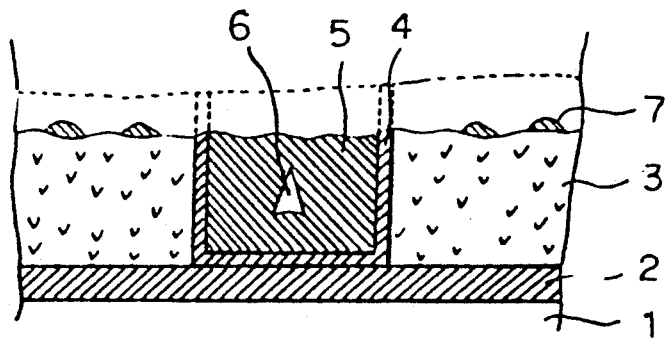
FIG. 1 is a cross-sectional view of the conventional tungsten interconnect state.
Figure 2:
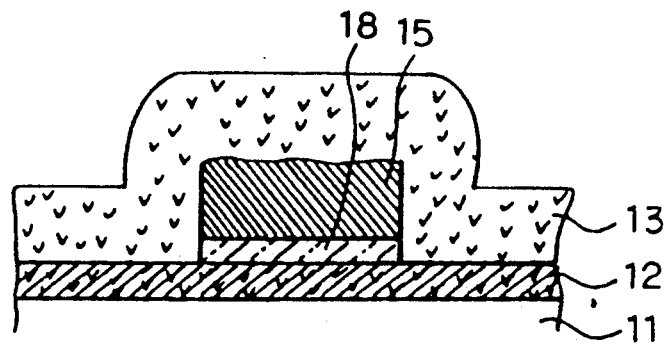
FIG. 2 is a cross-sectional view of the tungsten interconnect state fabricated according to the present invention.

FIG. 2 show a cross-sectional view of the tungsten interconnect state fabricated according to the present invention.

The polysilicon film 18 is formed after a first insulating film 12 is formed on a semiconductor substrate 11. Next, tungsten 15 to be used as the interconnect film is selectively grown on the polysilicon film 18, and a second insulating film 13 is subsequently deposited. These semiconductor devices are electrically connected through the tungsten 15. The tungsten 15 is electrically connected to the polysilicon film 18, while the polysilicon film 18 is connected through a contact region in the first insulating film 12 to the semiconductor substrate 11. Here, the contact region in the first insulating film 12 are not shown in figures. Finally, the second insulating film 13, that is, the protective film is deposited. The tungsten interconnect state as shown in FIG. 2 is made in sequence of processes shown in FIG. 3.

FIGS. 3A–E are show the various steps of the formation method of the tungsten interconnect pattern according to the present invention.

Many semiconductor devices are made on the semiconductor substrate 11 by repeating various fabrication processes, and the metal interconnection process is carried out to interconnect these devices to each other.

Figure 3A:
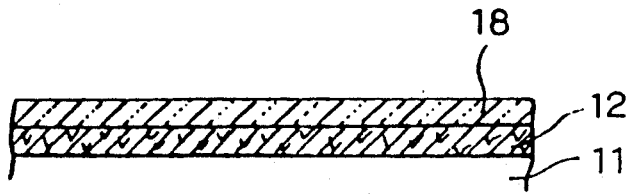

As shown in FIG. 3A, the insulating film 12 is deposited over the semiconductor substrate 11 by the CVD technology and the polysilicon film 18 of 500 Å thick is similarly deposited by the CVD technology, and subsequently the doping of phosphorus is carried out by the conventional method. Here, although not shown in the first insulating film 12, there is the contact portion where the first insulating film is not deposited. Thus, the semiconductor substrate 11 is electrically connected to the doped polysilicon film 18 through the contact portion.

Figure 3B:
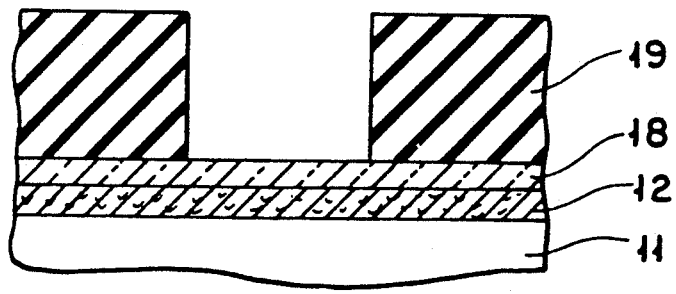

As shown in FIG. 3B, the region to be covered by the tungsten is formed. An oxide film 19 of high doping concentration for high wet etch rate is deposited over the polysilicon film 18 by the CVD technology. At this time, phosphorus (P) is injected into the oxide ranging 8 to 15 percent, or arsenic (As) is used to enhance the etch rate. The high-doped oxide film 19 forms the pattern by the photomasking and etching processes. At this, in the case of phosphorus doping the oxide film is formed as phosphorus silicate glass (PSG) and it can be also formed by using arsenic silicate glass (ASG) or spin on glass (SOG) film. In the etching process, the high-doped oxide film 19 is etched and the exposed portion of the polysilicon film 18 is the region where the tungsten 15 is to be grown.

Figure 3C:
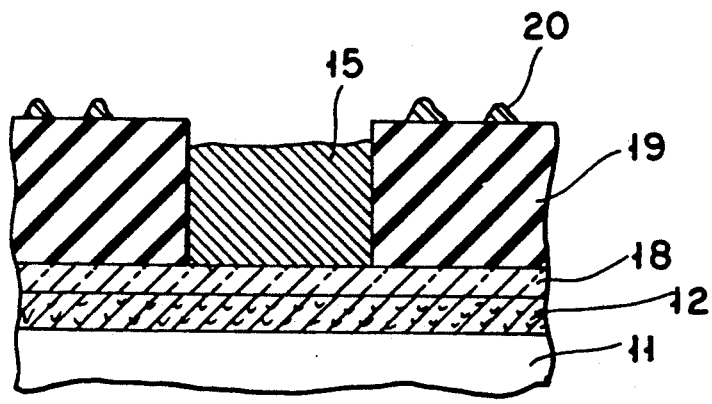

As shown in FIG. 3C, tungsten is deposited. The tungsten film 15 is grown over the polysilicon film 18 by the selective CVD technology. At 300° C., $WF_6$, $H_2$, and $SiH_4$ react on to deposite the tungsten film 15 over the polysilicon film 18, but since the area where the tungsten is selectively grown is large, a residual of the tungsten 20 is produced.

Figure 3D:
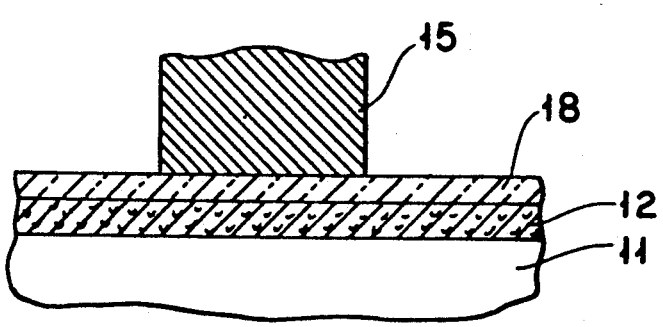

As shown in FIG. 3D, the residual formed on the oxide film is stripped. Stripping by using buffered oxide etchant (BOE) solution, the oxide film 19 and the residual 20 on the oxide film 19 are removed at the same time and only the tungsten 15 remains on the polysilicon film 18.

Figure 3E:
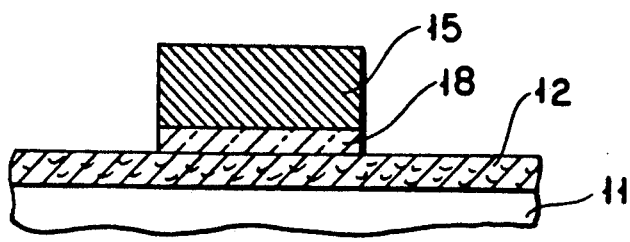

As shown in FIG. 3E, the polysilicon film is dry etched by using the tungsten as the etch mask. This dry etching is carried out by reactive ion etching (RIE) method, and a tungsten to polysilicon etch rate can be controlled ranging 1:1 to 1:5 by adjusting gas flow, pressure, time, and so on. Thus, by controlling the etch ratio, the upper part of the tungsten 15 is a little etched and the polysilicon film is entirely etched leaving only the polysilicon underneath the tungsten, thereby completing the pattern formation of the tungsten interconnect.

Subsequently, by the conventional formation of the protective film, the metal interconnect processes as shown in FIG. 2 are completed.

As mentioned up to now, the present invention can form tungsten interconnect pattern, which removes the voids defect in the tungsten interconnect line formed, independent of step coverage of the tungsten, and has no residual of the tungsten by growing selectively the tungsten using the pattern formation of the oxide film and stripping the oxide film. Also, there is no need to employ the adhesive film and etch back process of the tungsten so that the processes are simplified, and the roughness of the protective film deposited after a pattern formation of the tungsten is not deteriorated.

Accordingly, the present invention can solve the troubles produced when the tungsten is used as metal interconnect material and improve the operation speed of the semiconductor devices with the interconnection of the tungsten metal, offering a reliability of the device for a long time operation.

The invention is in no way limited to the embodiment described hereinabove. Various modifications of disclosed embodiment as well as other embodiments of the invention will become apparent to persons skilled in the art upon reference to the description of the invention. It is therefore contemplated that the appended claims will cover any such modifications or embodiments as fall within the true scope of the invention.

What is claimed is:

1. A method of making a pattern of tungsten interconnection, comprising the steps of:
    (a) forming a doped polysilicon film over a first insulating film on a semiconductor substrate;
    (b) forming a highly doped oxide film over the polysilicon film and providing a pattern of openings through the oxide film exposing surface portions of the polysilicon film;
    (c) growing selectively tungsten on the exposed portions of the polysilicon film;
    (d) removing the highly doped oxide film by wet etching and removing any residual of the tungsten formed on the oxide film at the same time; and
    (e) dry etching the polysilicon using the tungsten on the polysilicon as an etching mask leaving only the polysilicon underneath the tungsten.

2. A method according to claim 1, wherein in step (b) the highly doped oxide film is one of PSG, ASG and SOG films.

3. A method according to claim 1, wherein photomasking and etching processes are used to provide the pattern of openings in step (b).

4. A method according to claim 1, wherein $H_2$, $WF_6$ and $SiH_4$ are caused to react with each other at 300° C. in the performance of step (c).

5. A method according to claim 2 wherein said highly doped oxide film is phosphorous silicate glass having a phosphorous content in the range of 8–15 percent.

* * * * *